(12) United States Patent
Hamada et al.

(10) Patent No.: US 7,084,505 B2
(45) Date of Patent: Aug. 1, 2006

(54) POROUS FILM, COMPOSITION AND MANUFACTURING METHOD, INTERLAYER DIELECTRIC FILM, AND SEMICONDUCTOR DEVICE

(75) Inventors: Yoshitaka Hamada, Nakakubiki-gun (JP); Fujio Yagihashi, Nakakubiki-gun (JP); Hideo Nakagawa, Oumihachiman (JP); Masaru Sasago, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 204 days.

(21) Appl. No.: 10/808,361

(22) Filed: Mar. 25, 2004

(65) Prior Publication Data

US 2004/0188846 A1     Sep. 30, 2004

(30) Foreign Application Priority Data

Mar. 27, 2003   (JP)   .............................. 2003-087038

(51) Int. Cl.
*H01L 23/48* (2006.01)
(52) U.S. Cl. ...................... 257/758; 257/759; 257/410; 257/506; 257/701
(58) Field of Classification Search ................ 257/758, 257/759, 410, 506, 701
See application file for complete search history.

(56) References Cited

U.S. PATENT DOCUMENTS

| | | | | |
|---|---|---|---|---|
| 5,494,859 A | * | 2/1996 | Kapoor ........................ | 438/477 |
| 6,171,645 B1 | * | 1/2001 | Smith et al. ................. | 438/758 |
| 6,313,045 B1 | * | 11/2001 | Zhong et al. ............... | 438/758 |
| 6,589,644 B1 | * | 7/2003 | Yamada et al. ........... | 428/312.6 |
| 6,602,804 B1 | * | 8/2003 | Allen et al. ................. | 438/780 |
| 6,770,572 B1 | * | 8/2004 | Wu et al. .................... | 438/778 |
| 6,998,148 B1 | * | 2/2006 | You et al. ................... | 427/96.1 |

FOREIGN PATENT DOCUMENTS

JP       2000-44875 A    2/2000

* cited by examiner

*Primary Examiner*—Christian D. Wilson
*Assistant Examiner*—Douglas Menz
(74) *Attorney, Agent, or Firm*—Birch, Stewart, Kolasch & Birch, LLP

(57) ABSTRACT

A porous film-forming composition comprising (A) a curable silicone resin having a Mn of at least 100, (B) a micelle-forming surfactant, and (C) a compound which generates an acid upon pyrolysis remains stable during storage. The composition is coated and heat treated to form a porous film which has flatness, uniformity, a low dielectric constant and a high mechanical strength so that it is best suited as an interlayer dielectric film in the fabrication of semiconductor devices.

8 Claims, 1 Drawing Sheet

FIG.1

POROUS FILM, COMPOSITION AND MANUFACTURING METHOD, INTERLAYER DIELECTRIC FILM, AND SEMICONDUCTOR DEVICE

This Nonprovisional application claims priority under 35 U.S.C. § 119(a) on patent application No(s). 2003-087038 filed in JAPAN on Mar. 27, 2003, the entire contents of which are hereby incorporated by reference.

BACKGROUND OF THE INVENTION

1. Technical Field

This invention relates to a composition for forming a porous film having improved dielectric properties, adhesion, coating uniformity, mechanical strength, and minimized moisture absorption, a method of manufacturing a porous film, a porous film, an interlayer dielectric film, and a semiconductor device having a porous film built therein.

2. Background Art

In the progress of semiconductor integrated circuits toward higher integration, an increase of interconnect delay time caused by an increase of wiring capacitance which is a parasitic capacitance between metal wires becomes a barrier in enhancing the performance of semiconductor integrated circuits. The interconnect delay time, also known as RC delay, is in proportion to the resistance of metal wiring multiplied by the wiring capacitance.

Then, in order to shorten the interconnect delay time, the resistance of metal wiring or the wiring capacitance must be reduced.

A reduction of wiring capacitance is effective for preventing higher integration semiconductor devices from incurring an interconnect delay, enabling higher speed operation and suppressing power consumption.

As the means of reducing the wiring capacitance, it is believed effective to reduce the relative dielectric constant of an interlayer dielectric film formed between metal wirings. For the dielectric film having a low relative dielectric constant, porous films have been investigated as a substitute for prior art silicon oxide films. Among those films which can have a relative dielectric constant of 2.0 or less, porous films are almost only one class of practically applicable films. A number of methods for forming porous films have been proposed.

A first method of forming porous film involves synthesizing a siloxane polymer precursor containing a thermally unstable organic component and applying a solution of the precursor onto a substrate to form a coating. The coating is then heat treated for decomposing and volatilizing off the organic component, with a multiplicity of pores being left behind the volatilized component.

In a second method of forming porous film, a wet gel is formed by applying a silica sol solution onto a substrate or by CVD process. The silica sol is subjected to condensation reaction to form a porous film while volume shrinkage is restrained by precisely controlling the rate of evaporation of the solvent from the wet gel.

A third method of forming porous film involves applying a solution of silica fines onto a substrate to form a coating and firing the coating. In the consolidated coating, a multiplicity of pores are formed between silica fines.

As a fourth method of forming porous film, JP-A 2000-44875 proposes a porous film-forming composition comprising (A) a component of the formula: $R'_n SiO(OR'')_{4-n}$ wherein R' is a monovalent organic group, R'' is a monovalent hydrocarbon group and n is an integer of 0 to 2, (B) a metal chelate compound, and (C) a compound having a polyalkylene oxide structure.

These methods, however, have notable drawbacks.

The first porous film forming method suffers from an increased cost because a siloxane polymer precursor solution must be synthesized. Additionally, since the precursor solution is applied to form a coating, an amount of silanol groups remain in the coating, which gives rise to a degassing phenomenon that moisture or the like evaporates in the subsequent heat treatment step. The porous film can be deteriorated in quality by moisture absorption.

The second porous film forming method needs a special applicator apparatus capable of controlling the rate of evaporation of a solvent from a wet gel, adding to the cost. Since more silanol is left on surfaces of pores, the film as such is hygroscopic and susceptible to substantial quality deterioration. Thus surface silanol must be silylated, which complicates the process. In case a wet gel is formed by the CVD process, a special CVD system which is different from plasma CVD systems customarily used in the semiconductor process is needed, adding to the cost as well.

In the third porous film forming method, pores of a very large size are formed because the pore size is dictated by the deposition structure of silica fines. It is then difficult for the porous film to have a relative dielectric constant of 2.0 or less.

In the fourth porous film forming method, the metal chelate compound (B) is essential for improving the compatibility between components (A) and (C) and making uniform the thickness of a coating after curing. Undesirably, component (B) complicates not only the composition, but also the manufacturing process, and increases the cost. There is a need to have a composition which can form a uniform solution absent a chelate component and whose coating is flat even after curing.

For all these methods, a lowering of mechanical strength of porous films themselves is a problem. To maintain a practically acceptable level of strength, it would be effective that fine pores having a narrow size distribution be dispersed uniformly in the film.

Now attention is drawn to a porous silica material prepared by hydrolytic polycondensation of a silica precursor in the presence of micelle since it is characterized by a nanometer pore size, a narrow pore size distribution, a high regularity structure, and a very high mechanical strength for porous material. It is expected to find application as a carrier for various catalysts and an insulating material having a low dielectric constant. The porous silica material is generally prepared by forming a W/O type micelle in an aqueous solvent, causing a hydrolyzate of alkoxysilane dissolved in the aqueous layer to condense and crosslink to form a silica skeleton, and thereafter removing the surfactant that has formed the micelle, thereby introducing pores in the silica skeleton. If the silica skeleton has not been densified at this point, the film can be collapsed during the surfactant removal step, failing to effectively introduce pores. Then, the silica skeleton is generally formed by prolonging high-temperature heating under such conditions as to prevent evaporation of water or by performing long-term ripening under highly alkaline conditions.

For the application of porous silica material to low dielectric constant material for electronic use, attention is paid to the low dielectric constant expected from a high film strength and high porosity. It is urgently required to solve outstanding problems including the shelf stability of a film-forming composition, a process time, and acid and alkali leftovers.

As mentioned above, prior art materials suffer from problems such as the deterioration of film quality by heat treatment and increased costs. Another problem is the difficulty to reduce the dielectric constant of a porous film because the pore size is increased during film formation. A further problem is that when a prior art porous film is incorporated as a dielectric film for multilayer interconnections in semiconductor devices, the film fails to provide a mechanical strength necessary for the manufacture of semiconductor devices.

If the porous film used as a dielectric film for multilayer interconnections in semiconductor devices has a high relative dielectric constant, there arises a fatal problem that the RC delay in the multilayer interconnections of semiconductor devices is increased, so that no improvements in the performance of semiconductor devices (toward higher speed and lower power consumption) are achievable. The low mechanical strength of the porous film has a negative impact on the reliability of semiconductor devices.

SUMMARY OF THE INVENTION

An object of the invention is to provide a porous film-forming composition from which a porous film having a relative dielectric constant of 2.0 or less and a high mechanical strength can be formed by a practically acceptable process and at a low cost, a method of manufacturing a porous film, a porous film manufactured thereby, and an interlayer dielectric film. Another object is to provide a semiconductor device having a porous film built therein and featuring high performance and high reliability.

In one aspect, the present invention provides a porous film-forming composition comprising as essential components,

(A) 100 parts by weight of a curable silicone resin having a number average molecular weight of at least 100, (B) 5 to 50 parts by weight of a micelle-forming surfactant, and

(C) 0.01 to 10 parts by weight of a compound which generates an acid upon pyrolysis.

In another aspect, the present invention provides a method of manufacturing a porous film, comprising a step of applying the composition to a substrate to form a coating, a first stage of heat treatment of the coating at a temperature which is lower than the decomposition temperature or boiling point of component (B) and equal to or higher than the pyrolytic temperature of component (C), and a second stage of heat treatment of the coating at a temperature which is equal to or higher than the decomposition temperature or boiling point of component (B).

Through a survey of the prior art, the inventors know that in a process of forming a silica porous film from a composition comprising a silica precursor and a micelle-forming surfactant, by causing the silica precursor to condense and crosslink in interstices between micelles to form a silica skeleton, and removing the surfactant while retaining the silica skeleton, rigid and uniform pores are introduced if the step of forming a silica skeleton from a silica precursor is completed prior to the step of removing the surfactant through decomposition or volatilization. Since the recent study on the semiconductor processing technology reveals that long-term firing at high temperature accelerates the crystallization of copper responsible for electricity conduction and leads to circuit defectives, there is a need for a lower temperature process. More particularly, it is required that the decomposition or volatilization of the surfactant (B) be completed at a lower temperature. It is thus required that formation of a silica skeleton be performed at a lower temperature. Additionally, in incorporating the porous film-forming step in the semiconductor manufacturing process, it is a sovereign proposition to shorten the process time. On the other hand, the silica component generally contains Si—OR (wherein R is a monovalent hydrocarbon group) as well as Si—OH, wherein hydrolysis and dehydrating condensation take place to construct a siloxane network according to the scheme shown below.

($R^3$ is a substituted or unsubstituted monovalent hydrocarbon group.)

($R^3$ is a substituted or unsubstituted monovalent hydrocarbon group and may be identical with or different from $R^3$ in formula (11).)

In general, these condensation reactions require a high temperature of at least 250° C. absent a catalyst, but in the co-presence of an acidic or basic catalyst, proceed effectively at a lower temperature to form a film having a high hardness. However, the addition of an ordinary acidic or basic catalyst to the composition detracts from the storage stability of the composition noticeably because the condensation reactions can proceed even below room temperature. We have found that this problem can be overcome by adding a compound which generates an acid upon pyrolysis (or thermal decomposition) to the composition. More particularly, hydrolysis of organoxyalkoxysilane and condensation of silanol as shown by formulae (11) and (12) are accelerated by the acid generated upon pyrolysis, so that formation of a silica skeleton can be completed at a temperature below the decomposition or volatilization temperature of the surfactant. Since the compound which generates an acid upon pyrolysis remains neutral prior to pyrolysis, it has no negative impact on the storage stability of the silica precursor-containing composition. Moreover, the acid and other products of decomposition can be virtually completely decomposed or removed in the subsequent heat treatment step.

In a further aspect, the invention provides a semiconductor device having a porous film incorporated therein, the porous film being obtained using a porous film-forming composition comprising as essential components, (A) 100 parts by weight of a curable silicone resin having a number average molecular weight of at least 100, (B) 5 to 50 parts by weight of a micelle-forming surfactant, and (C) 0.01 to 10 parts by weight of a compound which generates an acid upon pyrolysis. Specifically, the porous film is used as dielectric films for multilayer interconnects in the semiconductor device.

Then, the porous films are minimized in moisture absorption while maintaining mechanical strength for a semiconductor device, so that a semiconductor device having low dielectric constant insulating films built therein is provided. The low dielectric constant of dielectric films ensures to reduce the parasitic capacitance around multilayer interconnects, contributing to a high speed and low power consumption in operation of the semiconductor device.

In a preferred embodiment of the inventive semiconductor device, the porous film is present as a dielectric film between metal wires in an identical layer in a multilayer interconnect structure or as an interlayer dielectric film between upper and lower metal wiring layers. A semiconductor device featuring high performance and high reliability is then provided.

DESCRIPTION OF THE PREFERRED EMBODIMENTS

Component (A) in the porous film-forming composition of the invention is a curable silicone resin having a number average molecular weight of at least 100, preferably 200 to 100,000, more preferably 400 to 20,000. It is preferably obtained by hydrolytic condensation of an organosilicon compound of the general formula (1) or (2) or a partial hydrolytic condensate thereof or a mixture of any.

$$SiZ_4 \tag{1}$$

$$R_xSiZ_{4-x} \tag{2}$$

Herein Z is independently at each occurrence a hydrolyzable group, R is independently at each occurrence a substituted or unsubstituted monovalent hydrocarbon group, x is an integer of 1 to 3.

The monovalent hydrocarbon groups represented by R are preferably those of 1 to 12 carbon atoms, and include alkyl, aryl, aralkyl and alkenyl groups and substituted forms of the foregoing groups in which some or all of the hydrogen atoms are substituted with halogen atoms (e.g., fluorine atoms) or epoxy-containing groups (e.g., glycidyl, glycidyloxy). Typical groups are alkyl, aryl, glycidyl and substituted alkyl groups. Suitable alkyl groups include methyl, ethyl, propyl and butyl and are preferably of 1 to 5 carbon atoms. The alkyl groups may be either straight or branched and may have hydrogen atoms substituted with fluorine atoms or the like. Suitable aryl groups include phenyl and naphthyl. Of these, methyl and phenyl are preferred, with methyl being most preferred.

Examples of the hydrolyzable group represented by Z include alkoxy groups such as methoxy, ethoxy, propoxy, isopropoxy, butoxy, sec-butoxy and t-butoxy, alkenoxy groups such as vinyloxy and 2-propenoxy, aryloxy groups such as phenoxy, acyloxy groups such as acetoxy, oxime groups such as butanoxime, amino groups and halogen atoms. Of these, alkoxy groups are preferred. Inter alia, methoxy, ethoxy, isopropoxy and butoxy groups are more preferred for ease of control during hydrolysis and condensation.

In a preferred embodiment, the curable silicone resin (A) comprises structural units derived by hydrolytic condensation of a tetrafunctional silane of the general formula (1):

$$SiZ_4 \tag{1}$$

wherein Z is a hydrolyzable group or a partial hydrolytic condensate thereof. Preferably the curable silicone resin (A) comprises at least 10 mol %, more preferably at least 30 mol %, most preferably at least 50 mol % of the above structural units.

Examples of the organosilicon compound (or tetrafunctional silane) of formula (1) include tetraalkoxysilanes such as tetramethoxysilane, tetraethoxysilane, tetra-n-propoxysilane, tetraisopropoxysilane, tetra-n-butoxysilane, tetraisobutoxysilane, tetra-2-butoxysilane, tetra-t-butoxysilane, tetra (acetylacetonato)silane, tetraphenoxysilane, dimethoxydi (acetonato)silane, and dimethoxydiethoxysilane; esters such as tetraacetoxysilane and tetraisocyanatosilane; silazanes such as tetrakis(dimethylamino)silane and tetrakis(diethylamino)silane; and halosilanes such as tetrachlorosilane and tetrabromosilane.

Examples of the silicon compound of formula (2) include alkoxysilanes such as trimethoxysilane, triethoxysilane, tri-n-propoxysilane, tri(acetylacetonato)silane, triphenoxysilane, dimethoxy(acetonato)silane, dimethoxyethoxysilane, methyltrimethoxysilane, methyltriethoxysilane, methyltri-n-propoxysilane, methyltriisopropoxysilane, methyltri-n-butoxysilane, methyltriisobutoxysilane, methyltri-2-butoxysilane, methyltri-t-butoxysilane, methyltri(acetylacetonato)silane, methyltriphenoxysilane, methyldimethoxy(acetonato)silane, methyldimethoxyethoxysilane, ethyltrimethoxysilane, ethyltriethoxysilane, ethyltri-n-propoxysilane, ethyltri(acetylacetonato)silane, ethyltriphenoxysilane, propyltrimethoxysilane, propyltriethoxysilane, propyltri-n-propoxysilane, butyltrimethoxysilane, butyltriethoxysilane, butyltri-n-propoxysilane, phenyltrimethoxysilane, phenyltriethoxysilane, phenyltri-n-propoxysilane, vinyltrimethoxysilane, vinyltriethoxysilane, vinyltri-n-propoxysilane, dimethoxysilane, diethoxysilane, dimethyldimethoxysilane, dimethyldiethoxysilane, dimethyldi-n-propoxysilane, dimethyldi(acetylacetonato)silane, dimethylditriphenoxysilane, dimethylmethoxy(acetonato)silane, dimethylmethoxyethoxysilane, diethyldimethoxysilane, diethyldiethoxysilane, diethyldi-n-propoxysilane, diethyldi(acetylacetonato)silane, diethyldiphenoxysilane, diethylmethoxy(acetonato)silane, diethylmethoxyethoxysilane, methyldimethoxysilane, methyldiethoxysilane, methylethyldimethoxysilane, methylethyldiethoxysilane, methylphenyldimethoxysilane, methylphenyldiethoxysilane, trimethylmethoxysilane, trimethylethoxysilane, dimethylmethoxysilane, dimethylethoxysilane, phenyldimethylmethoxysilane, and vinyldimethylmethoxysilane;

esters such as triacetoxysilane, triisocyanatosilane, methyltriacetoxysilane, methyltriisocyanatosilane, ethyltriacetoxysilane, ethyltriisocyanatosilane, propyltriacetoxysilane, propyltriisocyanatosilane, butyltriacetoxysilane, butyltriisocyanatosilane, phenyltriacetoxysilane, phenyltriisocyanatosilane, vinyltriacetoxysilane, vinyltriisocyanatosilane, dimethyldiacetoxysilane, dimethyldiisocyanatosilane, methylacetoxysilane, trimethylmethoxysilane, trimethylethoxysilane, dimethylmethoxysilane, phenyldimethylmethoxysilane, and vinyldimethylmethoxysilane;

silazanes such as triaminosilane, methyltriaminosilane, methyltris(diethylamino)silane, tris(dimethylamino)silane, tris(diethylamino)silane, methyltris(dimethylamino)silane, methyltris(diethylamino)silane, ethyltris(dimethylamino)silane, ethyltris(diethylamino)silane, dimethylbis(dimethylamino)silane, phenyldimethyldimethylaminosilane, and vinyldimethyldimethylaminosilane; and halosilanes such as trichlorosilane, tribromosilane, methyltrichlorosilane, methyltribromosilane, ethyltrichlorosilane, ethyltribromosilane, dimethyldichlorosilane, methyldichlorosilane, phenyldichlorosilane, trimethylchlorosilane, dimethylchlorosilane, phenyldimethylchlorosilane, and vinyldimethylchlorosilane.

Of these, alkoxysilanes, especially methoxysilanes and ethoxysilanes are preferably used for the ease of handling and distillation of by-products. The organosilicon compound which can be used herein is not limited to the foregoing. A mixture comprising at least one of the foregoing compounds is also useful. A choice is preferably made among these organosilicon compounds such that structures (T and Q units) derived from tri- and tetrafunctional silanes account for at least 50 mol %, more preferably at least 60 mol %, even more preferably at least 80 mol % of the entire silicone resin (A). If T and Q units do not sum to 100 mol %, the balance consists of structures (D and M units) derived from di- and monofunctional silanes.

Any well-known method may be employed in effecting hydrolytic condensation of the organosilicon compound to produce a silicone resin. For example, various hydrolyzable organic silane compounds as mentioned above are hydrolyzed and condensed in an aqueous solution at pH 1 to 7. The amount of water used for hydrolysis may be 50 to 5,000 parts by weight per 100 parts by weight of the silane compounds formulated so as to meet the above-described conditions or a mixture thereof.

Hydrolysis may be done by adding silane compounds to an aqueous solution, followed by agitation. A hydrolytic catalyst may be added to promote hydrolysis, especially at the initial. The hydrolytic catalyst may be added to either an aqueous solution before the silane compounds are added thereto, or a dispersion in which the silane compounds have been dispersed. The hydrolytic catalyst may be selected from prior art well-known catalysts and is preferably such that an aqueous solution having the catalyst added thereto exhibits an acidity corresponding to pH 1 to 7. Preferred catalysts include acidic hydrogen halides, carboxylic acids, sulfonic acids, acidic or weakly acidic inorganic salts, and solid acids such as ion exchange resins. Specific examples include mineral acids such as hydrofluoric acid, hydrochloric acid, nitric acid and sulfuric acid, organic acids such as acetic acid, maleic acid, and trifluoroacetic acid, sulfonic acids such as methanesulfonic acid, paratoluenesulfonic acid and trifluoromethanesulfonic acid, and cation exchange resins having sulfonate or carboxylate groups on their surface.

The amount of the hydrolytic catalyst, if used, is preferably in the range of 0.001 to 10 mol % based on the moles of hydrolyzable groups on silicon atoms. Silanol groups are likely to be very unstable under strong acidic conditions below pH 1 or under alkaline conditions in excess of pH 7. More preferably, the hydrolytic catalyst is used in such amounts that the aqueous solution to which it is added is kept at pH 2 to 6. Since the amount of water is in a large excess relative to the amount of hydrolyzable groups, hydrolysis proceeds to completion. By stirring at room temperature or elevated temperature under such conditions, condensation of silanol groups is readily driven.

Next, hydrolytic by-products may be removed from the solution containing the reaction mixture.

More particularly, the solution containing the silane reaction mixture resulting from the first step is converted into a system consisting essentially of a silanol group-containing silicone resin and water, by heating at a temperature of 80° C. or lower, preferably about 30 to 70° C. under atmospheric pressure, or by evacuating to 20 mmHg to atmospheric pressure at room temperature to 80° C., preferably room temperature to 70° C., for distilling off hydrolytic by-products such as alcohol. During the step, the silicone resin further increases its degree of condensation.

The silicone resin having undergone certain hydrolytic condensation in the first stage increases its molecular weight and gradually loses hydrophilicity with a further progress of condensation. At the same time, water becomes the majority of the external environment in which the silicone resin is kept dissolved.

After the hydrolytic by-products are removed in an amount of 30 to 100% of their formation, the silanol group-containing silicone resin is no longer dissolved in the solution, the solution turning slightly turbid or white turbid. After 50 to 100% of the hydrolytic by-products are removed, the silicone resin becomes insoluble in the water layer so that the resin settles down in a stationary state.

The silicone resin having separated from the water layer in this way can be taken out as such. Alternatively, an organic solvent which is not uniformly miscible with water is added whereupon the silicone resin in solution form can be separated from the water layer. Examples of the organic solvent used to this end include diethyl ether, diisopropyl ether, methyl isobutyl ketone, ethyl acetate, n-butyl acetate, isobutyl acetate, benzene, toluene and xylene.

The silicone resin used herein can be prepared in this way. As long as the silicone resin falls within the above-defined scope, any method may be used for the preparation thereof. The silicone resin is not constrained by the preparation method.

Component (B) is a micelle-forming surfactant which may be cationic, anionic, nonionic or ampholytic. Suitable surfactants having a micelle-forming ability which are used herein include long-chain alkyl quaternary ammonium salts such as octyltrimethylammonium salts, decyltrimethylammonium salts, lauryltrimethylammonium salts, myristyltrimethylammonium salts, cetyltrimethylammonium salts, and stearyltrimethylammonium salts, as well as long-chain alkyl ethers of polyethers, long-chain alkyl esters of polyethers, long-chain alkylsulfonic acid salts, and long-chain alkylcarboxylic acid salts.

The micelle-forming surfactant (B) is preferably selected such that the pyrolytic temperature of the compound which generates an acid upon pyrolysis (C) is lower than the pyrolytic temperature or boiling point of the micelle-forming surfactant (B).

The amount of the micelle-forming surfactant (B) used is 5 to 50 parts by weight, especially 10 to 30 parts by weight per 100 parts by weight of component (A). Less amounts of component (B) fail to introduce a sufficient quantity of pores whereas excessive amounts of component (B) adversely affect the strength of film.

Component (C) is a compound which generates an acid upon pyrolysis. Preferred examples of the compound which can be used herein include those generally known as onium salts, for example, sulfonium salts such as aromatic sulfonium salts, triarylsulfonium salts, and triarylthiopyrylium salts, diazonium salts such as naphthoquinonediazidosulfonic acid salts, diazonium compounds such as p-diazodiarylamines, oxonium salts such as triarylpyrylium salts, phosphonium salts, and iodonium salts, as well as aryl-substituted triazines sulfonylazide aromatic carboxylic acids, etc. Preferred are those compounds having a pyrolytic temperature of 150° C. or lower. More preferred are diazo compounds having the general formulae (3) and (4).

Herein $R^1$ and $R^2$ are each independently a substituted or unsubstituted monovalent hydrocarbon group.

Example of the monovalent hydrocarbon group represented by $R^1$ and $R^2$ include alkyl, cycloalkyl, aryl and aralkyl groups having 1 to 12 carbon atoms, and substituted forms of the foregoing in which some or all of the hydrogen atoms are substituted with halogen atoms such as fluorine atoms.

Of the diazo compounds, most preferred are compounds of the formulae (5) to (10).

The amount of the compound which generates an acid upon pyrolysis (C) used is 0.01 to 10 parts by weight, preferably 0.1 to 10 parts by weight, more preferably 1 to 5 parts by weight per 100 parts by weight of the silicone resin (A). Less amounts of component (C) do not promote effective construction of silica skeleton at a low temperature, causing pores to be collapsed or bulged whereas excessive amounts of component (C) are uneconomical and prevent decomposition residues from being volatilized off.

The inventive composition may be used after dilution in a solvent. Suitable solvents used herein include aliphatic hydrocarbon solvents such as n-pentane, i-pentane, n-hexane, i-hexane, n-heptane, 2,2,2-trimethylpentane, n-octane, i-octane, cyclohexane and methylcyclohexane;

aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, and n-amylnaphthalene;

ketone solvents such as acetone, methyl ethyl ketone, methyl n-propyl ketone, methyl n-butyl ketone, methyl isobutyl ketone, trimethylnonanone, cyclohexanone, 2-hexanone, methylcyclohexanone, 2,4-pentanedione, acetonylacetone, diacetone alcohol, acetophenone, and fenchone;

ether solvents such as ethyl ether, isopropyl ether, n-butyl ether, n-hexyl ether, 2-ethylhexyl ether, dioxolan, 4-methyldioxolan, dioxane, dimethyldioxane, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether, and dipropylene glycol dibutyl ether;

ester solvents such as diethyl carbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate;

nitrogen-containing solvents such as N-methylformamide, N,N-dimethylformamide, acetamide, N-methylacetamide, N,N-dimethylacetamide, N-methylpropionamide, and N-methylpyrolidone;

sulfur-containing solvents such as dimethyl sulfide, diethyl sulfide, thiophene, tetrahydrothiophene, dimethyl sulfoxide, sulfolane, 1,3-propane sultone. They may be used alone or in admixture of any.

In forming a film using the porous film-forming composition of the invention, the composition is first applied onto a substrate to form a coating. The substrates on which the inventive composition is applicable include semiconductor, glass, ceramics, metals and the like. Any desired application method may be used as long as it is used in the conventional manufacture of semiconductor devices. Exemplary are spin coating, dipping, and roller blade coating. The thickness of the coating thus formed is generally 0.2 to 20 mm in the case of interlayer dielectric film. The coating is then heated. This step, generally known as pre-baking, is intended to cause the solvent in the coating solution to evaporate for solidifying the coating in shape. The heating is at a sufficient temperature to evaporate the solvent in the coating solution.

The coating thus formed is subjected to a first stage of heat treatment or firing at such a temperature that component (C) decomposes to generate an acid and the decomposition of component (B) is almost negligible, thereby substantially completing the acid-catalyzed condensation of component (A) to form silica skeleton. In a second stage, the coating is heated at a sufficient temperature to decompose or volatilize the micelle-forming surfactant (B), thereby forming a cured film having pores therein.

Preferably, a temperature of 100 to 250° C. is used in the first stage of heating and a temperature of 200 to 350° C. is used in the second stage of heating. This sequence of heating ensures that a porous film having fine pores is formed from the inventive composition. The heating time is about 0.1 minute to about 1 hour, more preferably 0.5 to 5 minutes in the first stage. The second stage of heating continues for about 1 minute to about 1 hour, more preferably about 1 to 20 minutes. To ensure removal of pyrolytic residues, the process is preferably followed by firing at 400 to 500° C. for about one hour. At too low a heating temperature, cure of component (A) and decomposition and evaporation of component (B) proceed only a little, resulting in a film having a low mechanical strength on account of undercure. Too high a heating temperature can cause excessive decomposition of component (A) to detract from the strength of film and is not compliant with the semiconductor device manufacturing process.

With respect to the heating atmosphere, the pore distribution and mechanical strength of a film differ depending on whether the atmosphere is air or an inert gas. The physical properties of a film can be tailored by controlling the heating atmosphere. The heating atmosphere which can be used herein is any desired one and is not particularly limited. Examples of the inert gas include nitrogen gas and argon gas. In the practice of the invention, an inert gas atmosphere having an oxygen concentration of 5 ppm or less is preferably used. By heating in such an inert gas atmosphere, a film having a lower dielectric constant can be formed while avoiding the influence of oxygen.

In the film forming method of the invention, by performing the second stage of heating in vacuum, a film having a lower dielectric constant can be formed while promoting decomposition and volatilization of component (B) and avoiding the influence of oxygen.

The film obtained after heating the inventive composition according to the inventive method generally contains pores having a size of up to 100 nm and has a porosity of 30 to 70%. Also the film generally has a dielectric constant of 1.2 to 2.7, preferably 1.2 to 2.5. Then the inventive film is suited as a dielectric film, especially an interlayer dielectric film for high density integrated circuits.

The porous film of the invention is preferred as an interlayer dielectric film between wires in a semiconductor device. For semiconductor devices, the wiring capacitance must be reduced so that even higher integration incurs no wiring delay. While a variety of means have been envisioned to attain this purpose, one solution is to reduce the relative dielectric constant of an interlayer dielectric film formed between metal wires.

Fabrication of interlayer dielectric film using the porous film-forming composition of the invention enables miniaturization and speedup of semiconductor devices and even suppression of power consumed.

When pores are introduced into a film to make it porous for reducing its dielectric constant, the density of the material of which the film is made is reduced, giving rise to a problem that the film loses mechanical strength. The decline of mechanical strength not only has an impact on the strength of a semiconductor device itself, but also allows for separation because the film does not have a sufficient strength to withstand a mechanochemical polishing step commonly employed in the semiconductor fabrication process. Particularly when the porous film of the invention is used as interlayer dielectric films for multilayer interconnects in a semiconductor device, the film does not allow for such separation because of its high mechanical strength despite porosity. The semiconductor device thus fabricated is significantly improved in reliability.

Figure 1:
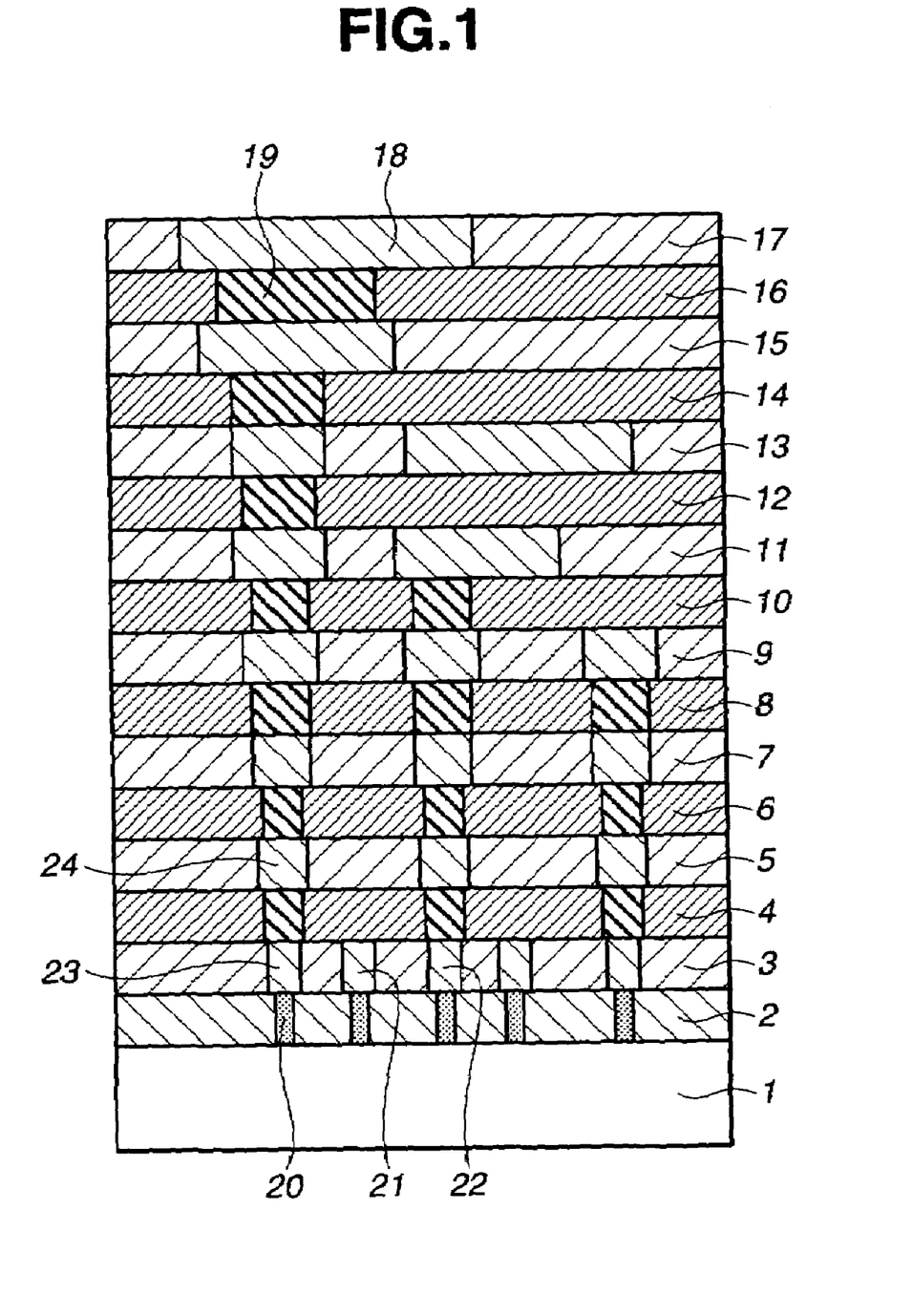

Now one embodiment of the inventive semiconductor device is described. FIG. 1 schematically illustrates in cross section a semiconductor device of the invention.

In FIG. 1, a substrate 1 is typically a silicon semiconductor substrate such as a silicon substrate or SOI (silicon-on-insulator) substrate while it may also be a compound semiconductor substrate such as SiGe or GaAs. An interlayer dielectric film for a contact layer is designated at 2. Interlayer dielectric films for wiring layers are designated at 3, 5, 7, 9, 11, 13, 15 and 17.

The wiring layers stacked from the bottom layer of interlayer dielectric film 3 for wiring layer to the top layer of interlayer dielectric film 17 for wiring layer are designated, in order, by abbreviations M1, M2, M3, M4, M5, M6, M7 and M8. Interlayer dielectric films for via layers are designated at 4, 6, 8, 10, 12, 14 and 16. Via layers stacked from the bottom layer of interlayer dielectric film 4 for via layer upward are designated, in order, by abbreviations V1, V2, V3, V4, V5, V6 and V7. Numerals 18 and 21 to 24 designate metal wires (or lines). Likewise, areas of the same hatching pattern designate metal wires. Numeral 19 designates a via plug formed of a metal. In the case of copper interconnection, copper is used. Likewise, areas of the same hatching pattern designate via plugs although numerals are omitted in FIG. 1. Numeral 20 designates contact plugs which are connected to the gates of transistors (not shown) formed in the top surface of the substrate 1 or to the substrate 1. As seen from the diagram, wiring layers and via layers are alternately laid one on top of the other. In general, the multilayer interconnect structure refers to an upper layer portion starting from M1. Most often, M1 to M3 are referred to as local interconnects, M4 and M5 are referred to as intermediate or semi-global interconnects, and M6 to M8 are referred to as global interconnects.

In the semiconductor device of the invention, the porous film of the invention is used as at least one layer of the interlayer dielectric films 3, 5, 7, 9, 11, 13, 15 and 17 for wiring layers or the interlayer dielectric films 4, 6, 8, 10, 12, 14 and 16 for via layers. For instance, in one embodiment wherein the inventive porous film is used as the interlayer dielectric film 3 for wiring layer (M1), the wiring capacitance between laterally adjacent metal lines 21 and 22 is significantly reduced. In another embodiment wherein the inventive porous film is used as the interlayer dielectric film 4 for via layer (V1), the wiring capacitance between vertically spaced-apart metal lines 23 and 24 is significantly reduced. As understood from these embodiments, when the inventive porous film having a low relative dielectric constant is used in the wiring layer, the capacitance between metal lines within the same layer can be significantly reduced; and when the inventive porous film having a low relative dielectric constant is used in the via layer, the capacitance between upper and lower metal wiring layers can be significantly reduced. Thus, using the inventive porous films in all the wiring layers and via layers, the parasitic capacitance of wiring can be dramatically reduced.

The use of the inventive porous film as a dielectric film for interconnection eliminates the problem of the prior art that a multilayer interconnect structure having porous films stacked experiences an increase of dielectric constant due to moisture absorption of porous films. As a result, a semiconductor device featuring high speed operation and lower power consumption is obtainable. Since the inventive porous film has a high mechanical strength, the semiconductor device is improved in mechanical strength. As a result, the semiconductor device is drastically improved in fabrication yield and reliability.

EXAMPLE

Examples are given below for illustrating the invention, but not intended to limit the invention.

Preparation Example 1

In a 50-ml flask, 15.22 g of tetramethoxysilane was hydrolyzed with 7.20 g of water (corresponding to twice the equivalent for hydrolysis) and 0.1 ml of 2N hydrochloric acid, yielding a silica precursor with Mw=1,450.

Preparation Example 2

In a 50-ml flask, a mixture of 11.42 g of tetramethoxysilane and 3.41 g of methyltrimethoxysilane was hydrolyzed with 6.75 g of water (corresponding to twice the equivalent for hydrolysis) and 0.1 ml of 2N hydrochloric acid, yielding a silica precursor with Mw=2,250.

Preparation Examples 3–7

Various surfactants, shown in Table 1, were added to the silica precursor solutions of Preparation Examples 1 and 2, which were diluted with water to form solutions having a solids (NV) concentration of 20%.

Note that Preparation Example is abbreviated as PE.

TABLE 1

|  | Resin | $C_{18}H_{37}NMe_3Cl$ | $C_{16}H_{33}NMe_3OH$ | $C_{16}H_{33}NMe_3OAc$ | $C_{12}H_{25}O(EO)_9H$ | Water |
|---|---|---|---|---|---|---|
| Preparation Example 3 | Preparation Example 1 | 3.4 g |  |  |  | 14.8 g |
| Preparation Example 4 | Preparation Example 1 |  | 3.0 g |  |  | 14.8 g |
| Preparation Example 5 | Preparation Example 1 |  |  | 3.3 g |  | 14.8 g |
| Preparation Example 6 | Preparation Example 1 |  |  |  | 2.9 g | 14.8 g |
| Preparation Example 7 | Preparation Example 2 | 3.4 g |  |  |  | 14.8 g |

Note:
Me = methyl,
Ac = acyl,
EO = ethylene oxide

Examples and Comparative Examples

A series of compositions were prepared by adding 2% by weight of NQDA or DAM (shown below) to the solutions of Preparation Examples 3 to 7. Each composition was spin coated onto a silicon wafer, dried in air, and heated at 100° C. for one minute for removing the solvent. Further the coating was heated at 170° C. for one minute to effect decomposition of NQDA or DAM and formation of silica skeleton and then at 250° C. for 10 minutes for decomposing off the surfactant. In a nitrogen stream, the resulting film was fired at 400° C. for one hour, accomplishing the removal of decomposed residues of polyether and NQDA or DAM and ripening the film.

TABLE 2

NQDA

DAM-1

DAM-2

|  | Composition | NQDA | DAM-1 | DAM-2 | Retentivity | Refractive index | Hardness (GPa) | Modulus (GPa) |
| --- | --- | --- | --- | --- | --- | --- | --- | --- |
| Example 1 | Preparation Example 3 | 2% |  |  | 92% | 1.31 | 0.9 | 13 |
| Example 2 | Preparation Example 4 | 2% |  |  | 93% | 1.31 | 0.9 | 12 |
| Example 3 | Preparation Example 5 | 2% |  |  | 91% | 1.33 | 0.9 | 12 |
| Example 4 | Preparation Example 6 | 2% |  |  | 89% | 1.31 | 0.8 | 10 |
| Example 5 | Preparation Example 7 | 2% |  |  | 87% | 1.32 | 0.8 | 11 |
| Example 6 | Preparation Example 3 |  | 2% |  | 92% | 1.31 | 1.0 | 13 |
| Example 7 | Preparation Example 4 |  | 2% |  | 93% | 1.31 | 1.0 | 13 |
| Example 8 | Preparation Example 5 |  | 2% |  | 92% | 1.33 | 0.9 | 11 |
| Example 9 | Preparation Example 6 |  | 2% |  | 89% | 1.31 | 0.8 | 10 |
| Example 10 | Preparation Example 7 |  | 2% |  | 87% | 1.32 | 0.8 | 10 |
| Example 11 | Preparation Example 3 |  |  | 2% | 92% | 1.31 | 1.0 | 13 |
| Example 12 | Preparation Example 4 |  |  | 2% | 93% | 1.31 | 0.9 | 12 |
| Example 13 | Preparation Example 5 |  |  | 2% | 91% | 1.33 | 0.9 | 12 |
| Example 14 | Preparation Example 6 |  |  | 2% | 89% | 1.31 | 0.8 | 10 |
| Example 15 | Preparation Example 7 |  |  | 2% | 88% | 1.32 | 0.8 | 10 |
| Comparative Example 1 | Preparation Example 3 |  |  |  | 91% | 1.38 | 0.7 | 7 |
| Comparative Example 2 | Preparation Example 4 |  |  |  | 92% | 1.40 | 0.6 | 6 |
| Comparative Example 3 | Preparation Example 5 |  |  |  | 90% | 1.43 | 0.6 | 6 |
| Comparative Example 4 | Preparation Example 6 |  |  |  | 85% | 1.39 | 0.5 | 5 |

TABLE 2-continued

| Comparative Example 5 | Preparation Example 7 | 84% | 1.37 | 0.4 | 4 |

Retentivity:

Film retentivity (%) is the thickness of film as 400° C./1 hr fired divided by the thickness of film as 120° C./1 min fired. A low retentivity indicates that the silica skeleton collapses upon pore formation.

Refractive Index:

measured at 25° C. by a spectroscopic ellipsometer.

Hardness and Young's modulus measured by the DCM-SAX method using Nano Indenter® (MTS Systems Corp.).

There has been described a porous film-forming composition which remains stable during storage. From the composition, a porous film is formed which is flat and uniform and has a low dielectric constant and a high mechanical strength. In the fabrication of semiconductor devices, the porous film is best suited as an interlayer dielectric film. Using the porous film as a dielectric film in a multilayer interconnection structure, a semiconductor device having high performance and high reliability is obtainable.

Japanese Patent Application No. 2003-087038 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A semiconductor device having a porous film incorporated therein, the porous film being obtained using a porous film-forming composition comprising
    (A) 100 parts by weight of a curable silicone resin having a number average molecular weight of at least 100,
    (B) 5 to 50 parts by weight of a micelle-forming surfactant, and
    (C) 0.01 to 10 parts by weight of a compound which generates an acid upon pyrolysis.

2. The semiconductor device of claim 1 wherein the curable silicone resin (A) comprises at least 10 mol % of structural units derived by hydrolytic condensation of a silane having the general formula (1):

$$SiZ_4 \quad (1)$$

wherein Z is a hydrolyzable group or a partial hydrolytic condensate thereof.

3. The semiconductor device of claim 1 wherein the compound (C) generates an acid upon pyrolysis at a pyrolytic temperature which is lower than the decomposition temperature or boiling point of the micelle-forming surfactant (B).

4. The semiconductor device of claim 3 wherein the pyrolytic temperature of the compound (C) is up to 150° C.

5. The semiconductor device of claim 4 wherein the compound (C) is a diazo compound of the general formula (3) or (4):

$$R^1-S(O_2)-C(=N_2)-S(O_2)-R^2 \quad (3)$$

$$R^1-C(=O)-C(=N_2)-S(O_2)-R^2 \quad (4)$$

wherein $R^1$ and $R^2$ are each independently a substituted or unsubstituted monovalent hydrocarbon group.

6. The semiconductor device of claim 5 wherein the diazo compound is selected from compounds of the formulae (5) to (10):

(5) Ph-S(O)$_2$-C(=N$_2$)-S(O)$_2$-Ph (6) Cl-C$_6$H$_4$-S(O)$_2$-C(=N$_2$)-S(O)$_2$-C$_6$H$_4$-Cl (7) (3,5-(CH$_3$)$_2$C$_6$H$_3$)-S(O)$_2$-C(=N$_2$)-S(O)$_2$-(3,5-(CH$_3$)$_2$C$_6$H$_3$)

(8) Ph-C(=O)-C(=N$_2$)-S(O)$_2$-Ph (9) Cyclohexyl-S(O)$_2$-C(=N$_2$)-S(O)$_2$-Cyclohexyl (10) (CH$_3$)$_3$C-S(O)$_2$-C(=N$_2$)-S(O)$_2$-C(CH$_3$)$_3$ 7. The semiconductor device of claim 1 wherein said composition further comprises a solvent.

8. The semiconductor device of claim 1 wherein the porous film is present as a dielectric film between metal lines in an identical layer in a multilayer interconnect structure or an interlayer dielectric film between upper and lower metal wiring layers.

* * * * *